United States Patent [19]

Geekie

[11] Patent Number: 4,893,166

[45] Date of Patent: Jan. 9, 1990

[54] HIGH VALUE SEMICONDUCTOR RESISTOR

[75] Inventor: James Geekie, Santa Clara, Calif.

[73] Assignee: Siliconix Incorporated, Santa Clara, Calif.

[21] Appl. No.: 313,737

[22] Filed: Feb. 21, 1989

Related U.S. Application Data

[62] Division of Ser. No. 88,157, Aug. 21, 1987, Pat. No. 4,843,027.

[51] Int. Cl.$^4$ .............................................. H01L 27/04
[52] U.S. Cl. ...................................... 357/51; 357/55; 357/56; 437/60; 437/918
[58] Field of Search .......................... 357/151, 55, 56; 437/60, 918, DIG. 136

[56] References Cited

FOREIGN PATENT DOCUMENTS

| | | | |
|---|---|---|---|
| 55-1103 | 1/1980 | Japan | 357/51 |
| 62-150873 | 7/1987 | Japan | 357/51 |

Primary Examiner—Andrew J. James
Assistant Examiner—David Soltz
Attorney, Agent, or Firm—Steven F. Caserza

[57] ABSTRACT

In accordance with the teachings of this invention, resistors are fabricated in semiconductor devices utilizing a layer of semiconductor material having a preselected resistivity. Means are provided for electrically isolating the semiconductor region from the regions located beneath, and isolation to adjacent regions is provided by forming a groove. Resistance value of a particular resistor fabricated in accordance with the teachings of this invention is dependent, in a coarse fashion, on the length and width of the resistor, as well as the resistivity of the semiconductor material used to fabricate the resistor. However, the final resistance value is determined by the diffusion of high concentration isolation dopants which serve to accurately control the effective cross-sectional area of the resistor. Once the rough physical dimensions of a resistor have been established, its actual resistance value is controlled very closely by, for example, introducing isolation dopants, diffusing the isolation dopants for a specified period of time, measuring a resistance value and, if necessary, further diffusing the isolation dopants. This iterative process of diffusing isolation dopants and measuring resistance value is repeated as required in order to fabricate resistors of desired resistance values.

10 Claims, 4 Drawing Sheets

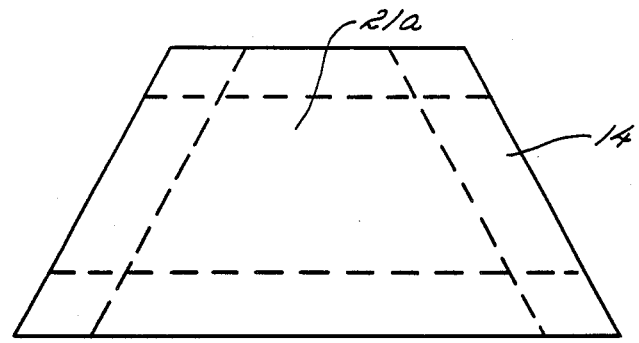
FIG. 3a - TRAPEZOID
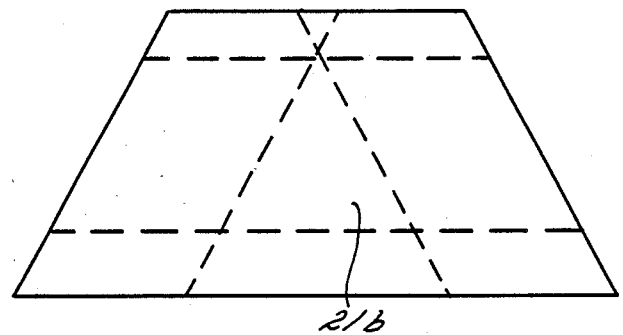
FIG. 3b - TRIANGULAR

HIGH VALUE SEMICONDUCTOR RESISTOR

This is a division of application Ser. No. 088,157, filed Aug. 21, 1987 now U.S. Pat. No. 4,843,027.

BACKGROUND OF THE INVENTION

This invention pertains to a method of fabricating very high value resistors in conductive epitaxial layers grown over isolation sublayers, and the resulting structure.

During the fabrication of semiconductor devices, it is often times necessary to provide one or more resistors of predefined values over a wide range of resistance values. Heretofore, such resistors have typically been fabricated, for example, using relatively high resistivity diffused regions in the semiconductor body, or utilizing a relatively high resistivity polycrystalline silicon interconnect layer. Alternatively, active devices, such as transistors, have been configured as load devices. However, these prior art techniques generally do not provide resistors having resistance values which are closely regulated across a single device, devices fabricated across a wafer, or from lot to lot. Furthermore, diffused resistors and polycrystalline silicon resistors tend to require a relatively large amount of semiconductor surface area, thereby adding to the expense of semiconductor devices.

SUMMARY

In accordance with the teachings of this invention, resistors are fabricated in semiconductor devices utilizing a layer of semiconductor material having a preselected resistivity. Means are provided for electrically isolating the semiconductor region from the regions located beneath, and isolation to adjacent regions is provided by forming a groove, thereby forming an island of semiconductor material which will serve as a resistor. The resistance value of a particular resistor fabricated in accordance with the teachings of this invention is dependent, in a coarse fashion, on the length and width of the resistor, as well as the resistivity of the semiconductor material used to fabricate the resistor. However, the final resistance value is determined by rediffusion, whereby the cross-section of the resistor is reduced as the surrounding peripheral region of the resistor having higher dopant concentration advances inward. The attributes of the original resistor material in the center of the island remain unchanged from that established in the doped peripheral portion of the resistor. This iterative process of rediffusion of isolation dopants and measuring resistance value is repeated as required in order to fabricate resistors of desired resistance values.

BRIEF DESCRIPTION OF THE DRAWINGS

FIGS. 3A and 3B depict the general cross-sectional areas of resistors fabricated in accordance with the teachings of this invention.

DETAILED DESCRIPTION

As will be appreciated, in accordance with the teachings of this invention, the conductive epitaxial layer may be either N or P type, but in the following fabrication sequences, only the N type will be described. Similarly, the isolation sublayers may have either localized doping, or general doping across the whole sublayer. One embodiment utilizing localized doping to form a localized isolation region is demonstrated by the fabrication steps in FIGS. 1A through 1F, while one embodiment utilizing general doping to form a general isolation region is demonstrated in FIGS. 2A through 2F, with similar numerical designations used where appropriate.

Figure 1A:
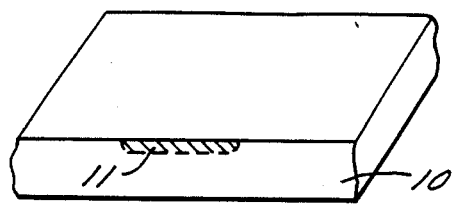
FIGS. 1A through 1G represent cross-sectional views of a resistor fabricated in a semiconductor device in accordance with the teachings of one embodiment of this invention.
Figure 2A:
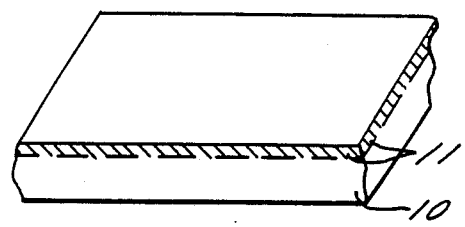
FIGS. 2A through 2G depict the fabrication of a resistor in a semiconductor device in accordance with the teachings of this invention.
Figure 1B:
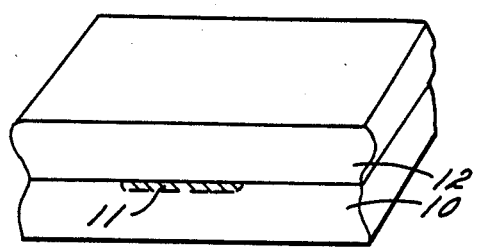
Figure 2B:
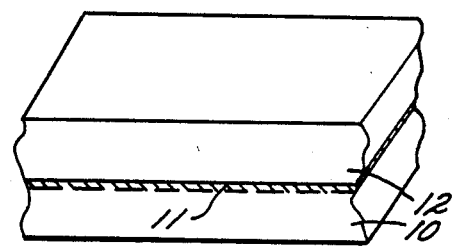

Referring to FIGS. 1A and 2A, P-type dopant is diffused into N-type sublayer 10 to form P-type isolation region 11. Next, conductive epitaxial layer 12, having a preselected resistivity (typically in the range of 1.5 $\Omega$cm), is formed to a thickness in the range of 6.0 $\mu$ms over sublayer 10, as shown in FIGS. 1B and 2B.

Figure 1C:
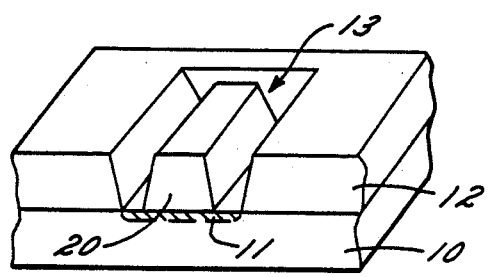

Using an anisotropic etchant, such as KOH, groove 13 defining the boundaries of to-be-formed resistor 20 is etched completely through epitaxial layer 12 into isolation region 11, as shown in FIG. 1C for the embodiment utilizing localized isolation.

Figure 2C:
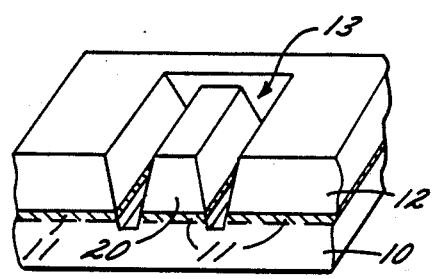

In contrast, the embodiment utilizing general isolation, the etch is continued through isolation layer 11 as shown in FIG. 2C in order to allow for general isolation, i.e., isolation from every other component in the semiconductor device being fabricated.

Preferably, the bottom of etched groove 13 is not fully etched to a complete V-groove, but deliberately only partially etched, to leave a flat bottom. This allows better metal step coverage when later providing connections from resistor 20 to other circuitry.

Figure 1D:
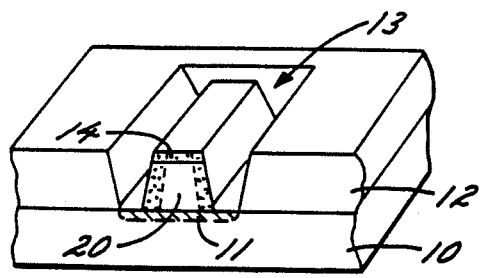
Figure 2D:
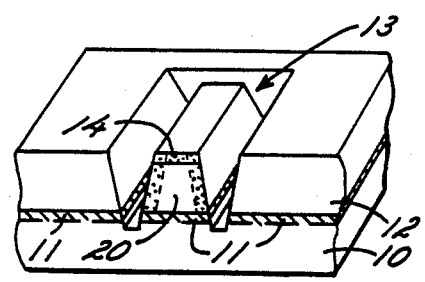
Figure 1E:
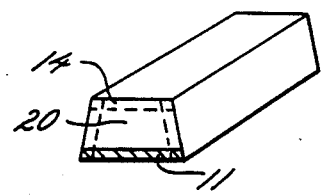
Figure 2E:
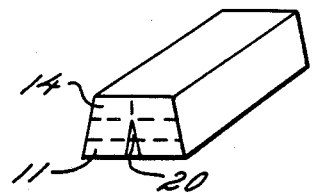

In effect, the to-be-formed resistor 20 is an island of semiconductor material. P-type dopant is then diffused into the top and sides 14 of epitaxial resistor 20 to further reduce the N-type conductive cross-section of the resistor, as shown in FIGS. 1D and 2D. This P-type diffusion is continued in order to reduce this conductive cross-section of resistor 20, as illustrated in FIGS. 1E and 2E, thereby increasing the resistance of resistor 20, until a desired resistance value is attained.

Figure 1F:
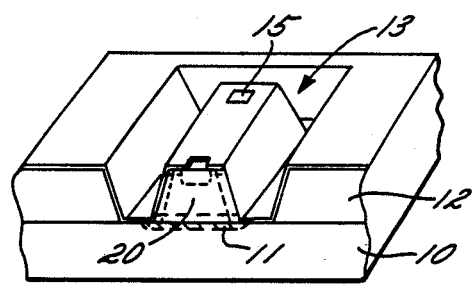
Figure 2F:
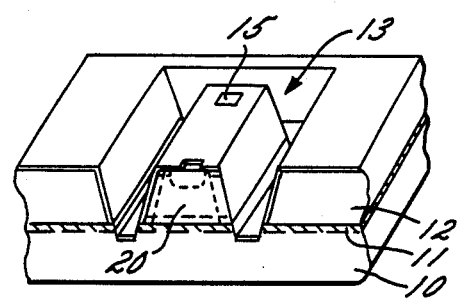

Using well known photolithographic techniques, electrical contact areas 15 are then selected and diffused with high concentration N-type dopant to provide low contact resistance, as shown in FIGS. 1F and 2F. These electrical contact regions have no significant effect on the ultimate resistance value of the resistor being formed, but serve to provide a good electrical connection to the resistor. Then a layer of insulation such as silicon dioxide is then formed (for example by thermal growth) over the entire surface of the device. Using well known photolithographic techniques, contact windows are defined and patterned, for example by etching through the layer of insulation to expose heavily doped contact areas 15.

Figure 1G:
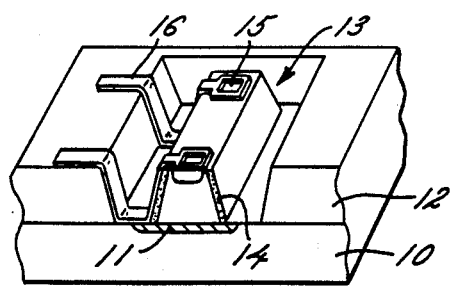
Figure 2G:
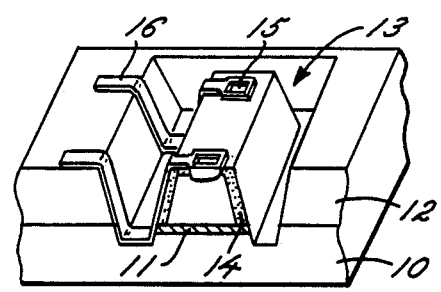

An electrically conductive layer, such as an alloy of aluminum or polycrystalline silicon is deposited and patterned to form an electrical interconnect pattern 16 to connect resistor 20 via electrical contacts 15 to some other circuit location, as shown in FIGS. 1G and 2G.

The values of resistors attained by this method are calculated from the formula:

$$R = (\rho L/A)$$

where:
R = resistance of the resistor;
ρ = resistivity of the semiconductor material used to fabricate the resistor;
L = distance between contact diffusions; and
A = conductive cross-section area.

Of importance, the sides and top of the resistor structure do not contribute to the resistivity of the resistor, because they are not connected to the electrical contacts 15 and the peripheral and central portions of the island of semicoductor material form an N-P diode which is reverse-biased to prevent conduction in the more highly doped peripheral regions located at the top and sides of the conductive resistor region.

The cross sectional area of resistors formed in accordance with this invention have two basic shapes—a trapezoid-like core 21a or a triangular-like core 21b, as shown in FIGS. 3A and 3B respectively. As the conductive cross-section is reduced through controlled diffusion, the core becomes more triangular-like.

The maximum value of resistor attainable is limited by the leakage current of the isolation junctions surrounding the conductive core 21a, 21b, i.e., the leakage between the N-P junction formed between the resistor isolation regions and formed at the top and sides of the conductive resistor region. For practical purposes, this limit is approximately $10^{11}$ ohms.

Fabricating resistors according to the teachings of this invention allows very high value resistors to be constructed on relatively small semiconductor surface areas. The final value of resistance is determined by diffusion time of the isolation dopants advancing into the conductive core. A test and redifusion sequence can readily be employed to target this value to preferred resistance with easy control in a manner which is highly accurate and repeatable. The fabrication steps used to fabricate resistors in accordance with this invention are readily available during fabrication of other active devices on a monolithic semiconductor chip, such as bipolar transistors, field effect transistors, and diodes. By controlling the physical size of the etched grooves 13, and thus the length and width of the epitaxial layer contained within grooves 13 to be used for fabrication of resistors 20, resistors of widely varying resistances can be fabricated simultaneously using the same fabrication steps.

Preferably, resistors fabricated in accordance with this invention occupy a minimum surface area while maintaining a high length to cross-section ratio. The high ratio provides better control of resistance values over normal process variations.

An engineering design experiment was conducted to fabricate a gate resistor of value approximately $10^9$ ohms to be connected to the gate of a field effect transistor in an existing circuit with matching diodes, using a known process. The resistor was fabricated in an area of 4.70×8.00 mils with the length to cross-section ratio as high as practical.

Figure 4:
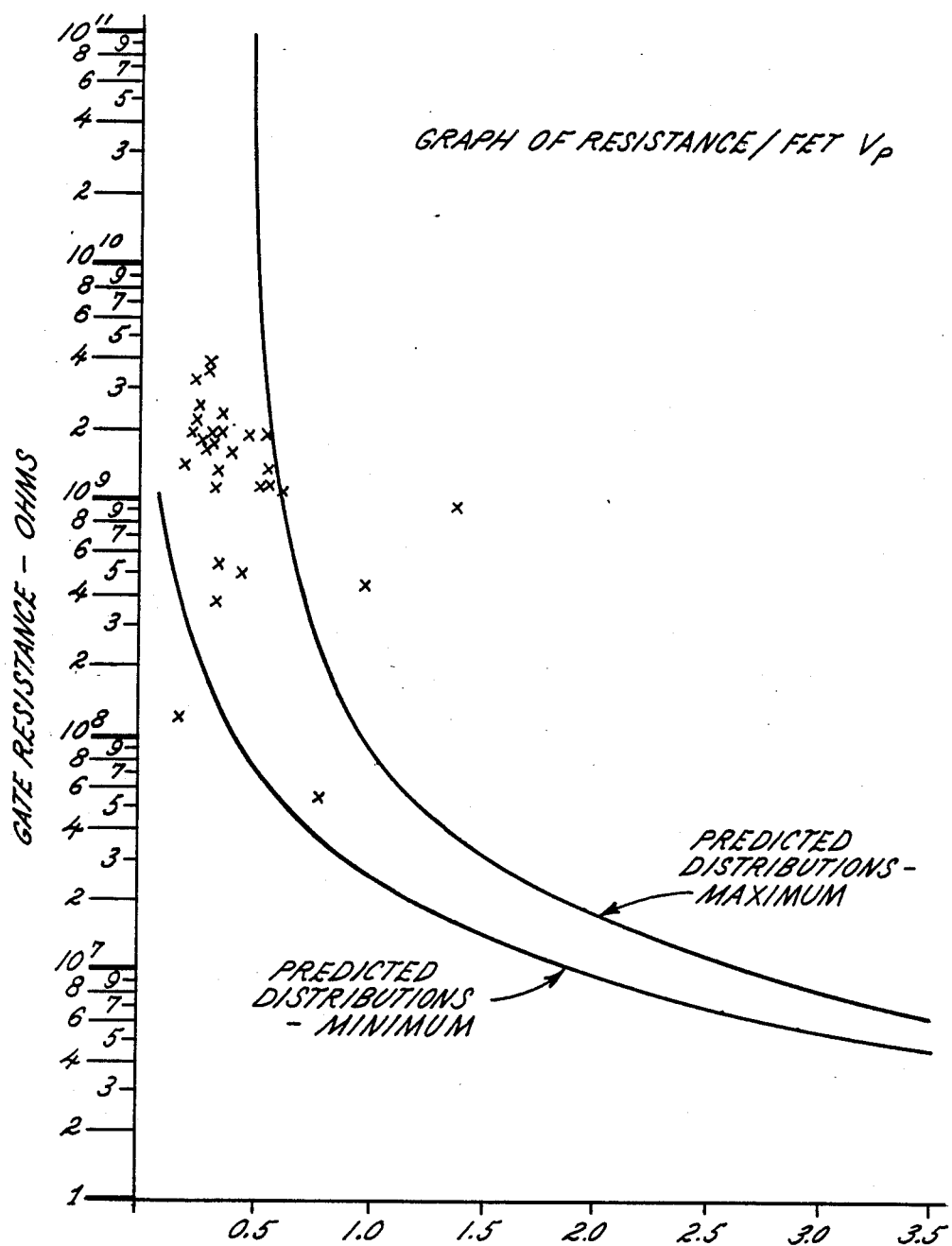
FIG. 4 is a graph depicting resistance values achieved in a semiconductor structure which includes field effect transistors where rediffusion is used in accordance with the teachings of this invention to provide specific resistor values in conjunction with specific $V_p$ FET values.

Results from the design experiment are shown in FIG. 4 with lines for estimated results. The lines in FIG. 4 are shown as gate resistance versus FET pinch off voltage (Vp), since all process rediffusions were aimed at a specific FET $V_p$ target, in this case 0.2 to 0.8 Volts. In other words, since all FET devices prior to rediffision have an initial $V_p$, controlled rediffusion reduces the value of $V_p$ to a predetermined value. In the specific case mentioned above and shown in FIG. 4, it is desired to provide controlled rediffusion to reduce the FET $V_p$ value to a range of 0.2 to 0.8 volts. Thus, in this example the resistor of this invention was designed to provide a desired resistance value given the amount of rediffusion required to produce the desired $V_p$. FIG. 4 can be viewed as a measure of the success of the method of this invention to produce $10^9$ ohm resistors while simultaneously providing FETs have $V_p$ within the desired range of 0.2 to 0.8 volts.

All publications and patent applications are herein incorporated by reference to the same extent as if each individual publication or patent application was specifically and individually indicated to be incorporated by reference.

The invention now being fully described, it will be apparent to one of ordinary skill in the art that many changes and modifications can be made thereto without departing from the spirit or scope of the appended claims.

What is claimed is:

1. A semiconductor structure comprising:
   a sublayer formed of semiconductor material of a first conductivity type;
   a semiconductor layer of said first conductivity type formed on said sublayer;
   a groove formed in said semiconductor layer substantially to said sublayer, thereby forming an island of said semiconductor layer;
   a peripheral region of said island of said semiconductor layer, formed as the top and sides of said island, said peripheral region being doped to a second conductivity type opposite said first conductivity type; and
   an isolation region formed in said sublayer beneath said island of semiconductor material, said isolation region being of said second conductivity type,
   whereby a central portion of said island remains doped to said first conductivity type,
   whereby said central portion of said island serves as a resistor and said peripheral portion of said island is junction isolated from said central portion.

2. A semiconductor structure as in claim 1, wherein said sublayer is semiconductive material.

3. A semiconductor structure as in claim 1 wherein said semiconductor layer has an impurity concentration in the range of approximately $5 \times 10^{14}$ to $8 \times 10^{16}$ atoms/cc.

4. A semiconductor structure as in claim 3, wherein said peripheral region has an impurity concentration in the range of approximately $5 \times 10^{16}$ to $1 \times 10^{20}$.

5. A semiconductor structure as in claim 1, wherein the resistance of said island of semiconductor material is determined in part by the extent of said peripheral region.

6. A semiconductor structure as in claim 1, including a contact region formed to make electrical contact with said island.

7. A semiconductor structure as in claim 6, including an electrical interconnect making connection with said contact region.

8. A semiconductor structure as in claim 7, wherein said electrical interconnect is formed within said groove over at least part of its length.

9. A semiconductor structure as in claim 1, including an insulation layer over said island.

10. A semiconductor structure as in claim 1, wherein said peripheral region is adjacent the top and sides of said island.

* * * * *